United States Patent [19]

Yeh et al.

[11] 4,253,229
[45] Mar. 3, 1981

[54] SELF-ALIGNED NARROW GATE MESFET PROCESS

[75] Inventors: Keming Yeh, Westchester; James L. Reuter, Rancho Palos Verdes, both of Calif.

[73] Assignee: Xerox Corporation, Stamford, Conn.

[21] Appl. No.: 900,635

[22] Filed: Apr. 27, 1978

[51] Int. Cl.³ .............................................. B01J 17/00
[52] U.S. Cl. .................................. 29/571; 29/577 R; 29/578; 29/580; 357/15; 357/59; 427/84; 427/91
[58] Field of Search ................. 29/571, 578, 580, 577; 357/15, 59; 427/84, 91

[56] References Cited

U.S. PATENT DOCUMENTS

| | | | |
|---|---|---|---|
| 3,604,107 | 9/1971 | Fassett | 29/571 |
| 4,048,712 | 9/1977 | Buiatti | 29/571 |
| 4,102,733 | 7/1978 | De La Moneda | 29/571 |
| 4,124,933 | 11/1978 | Nicholas | 357/59 |

*Primary Examiner*—W. C. Tupman
*Attorney, Agent, or Firm*—Ronald L. Taylor

[57] ABSTRACT

A method of making a narrow gate MESFET including the steps of placing a layered mask of nitride and polysilicon over a channel region for self-aligning in a substrate, oxidizing and then removing the polysilicon to reduce the remaining polysilicon width, etching the nitride to the polysilicon width, oxidizing the substrate where the nitride defines the gate therein, removing the nitride, and depositing metal on the gate to form the MESFET Schottky gate. Advantages of the improved MESFET include a relatively higher device gain, greater IC density, a self-aligned Schottky gate, controllable minimum series resistance, a relatively short channel using a conventional photo process, and a n-resistor that may be easily simultaneously fabricated therewith.

16 Claims, 17 Drawing Figures

SELF-ALIGNED NARROW GATE MESFET PROCESS

FIELD OF THE INVENTION

This invention relates to MESFET devices.

BACKGROUND OF THE PRIOR ART

MESFETS are characterized by a metal gate in contact with a channel region. In particular, in a VLSI environment, conventional MESFET's suffer from relative device gain degradation due to series resistances which can only be improved to a limited degree by an advanced pattern reproduction alignment process which is relatively very costly and complicated.

As such, there exists a need for a process that will efficiently fabricate MESFET's in an VSLSI environment using a conventional photolithgraphic process.

SUMMARY OF THE INVENTION

Accordingly, it is an object of the invention to provide an improved process for making self-aligned narrow gate MESFET's having controllable minimum series resistances.

It is another object of the invention to provide a process for fabricating relatively high-speed, high-density, low-power MESFET's in a VLSI environment.

Yet another object of the invention is to provide a process for obtaining relatively high-gain, short-channel MESFET's using conventional photolithographic processes.

BRIEF DESCRIPTION OF THE DRAWINGS

Various other objects, advantages and maritorious features of the invention will become more fully apparent from the following specification, appended claims and accompanying drawing sheets wherein:

DESCRIPTION OF THE PREFERRED EMBODIMENT

Figure 1:
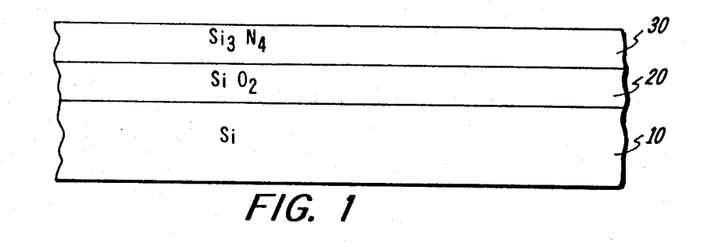
FIG. 1 is a schematic representation of a portion of the MESFET process sequence at a point where initial oxidationation, and nitride deposition have been accomplished.

Referring generally to FIGS. 1-7, and specifically to FIG. 1, there is shown a schematic representation of the part of the process sequence including the steps of initial oxidation and nitride deposition. In particular, a silicon (Si) substrate 10 is positioned to have a silicon dioxide (SiO$_2$) layer 20 thermally formed on its top surface as part of initial oxidation to a predetermined depth. Next, a layer of silicon nitride (Si$_3$N$_4$) 30 is deposited to a predetermined depth over the initial silicon dioxide layer 20 through chemical vapor deposition.

Figure 2:
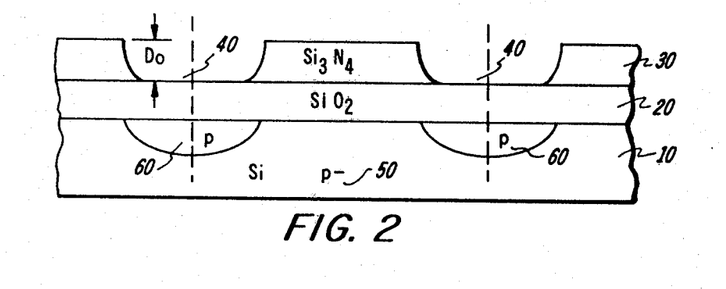
FIG. 2 is a schematic representation of a portion of the MESFET process sequence, following that of FIG. 1, at a point where nitride mask, field implant, and nitride etch have been accomplished.

In regards to FIG. 2, there is shown a schematic representation of that part of the process sequence including the steps of nitride masking, field implanting and nitride etching. In particular, a nitride mask (not shown) is selectively laid down with bare areas that will ultimately define the windows or contacts 40 described infra. Next, boron-ion field implants are made to obtain p-type (p)60 and P minus (P−) type 50 material regions or areas in the silicon substrate 10 where the p-type (p)60 is the result of ion implants utilizing a predetermined amount of boron and the p-minus (−) type 50 is the result of substrate boron doping. The dosage of the p (60) being greater than the p-(50). The final step represented in FIG. 2 involves the selective nitride etching or removal (not shown) of the silicon nitride layer 20 leaving the windows 40 mentioned supra exposed to a predetermined depth DO interfacing with the SiO$_2$(20) layer.

Figure 3:
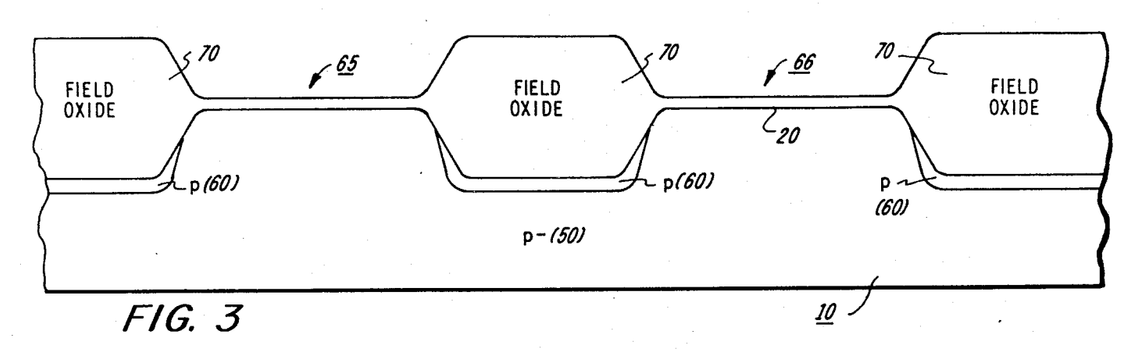
FIG. 3 is a schematic representation of a portion of the MESFET process sequence, follow that of FIG. 2, at a point where field oxidation has been accomplished.

In regards to FIG. 3, there is shown a schematic representation of that part of the process sequence including the steps of field oxidation. In particular, field oxide is thermally formed at a predetermined depth at areas 70, in the SiO₂ layer 20 that are substantially vertically aligned as to boundaries with the windows 40 of FIG. 2 mentioned supra, and is substantially thicker than the remainder of the SiO₂ layer 20 thereby giving it additional stabilization qualities relative thereto. It will be noted that the valleys 65 and 66 will be subsequently operative to define first and second MESFETS as will be described infra.

Figure 4:
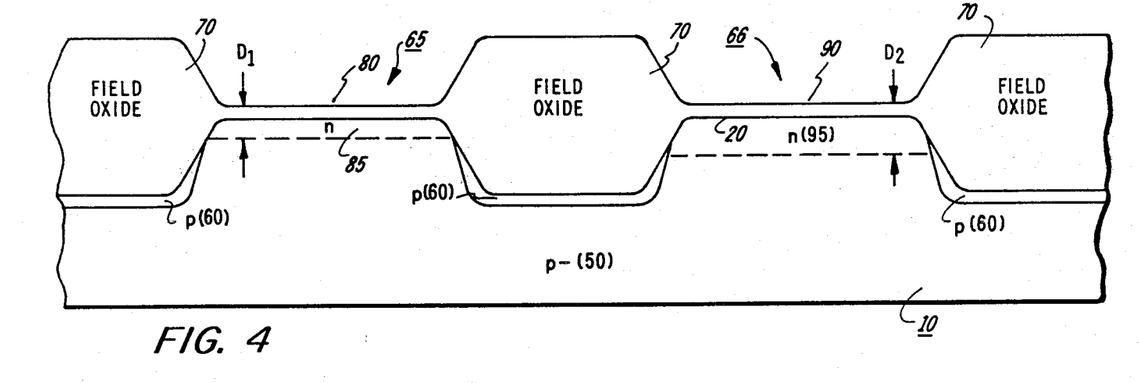
FIG. 4 is a schematic representation of a portion of the MESFET process sequence, following that of FIG. 3, at a point where nitride etching, blank n-enhancement implanting, depletion masking and deep depletion implanting have been accomplished.

In regards to FIG. 4, there is shown a schematic representation of that part of the process sequence including the steps of nitride etch, blank N-minus (N−) enhancement implanting, depletion masking, and deep depletion implanting. In particular, a nitride etch or removal is made (not shown). Next, a first implant is applied using a blank N− enhancement technique utilizing a predetermined amount of phosphorous to define an N− channel (85) adjacent to a first gate area or region 80 of the first MESFET 65 having a given dosage to predetermined depth D1. Then a depletion mask (not shown) is applied to define depletion channels. In addition, a second implant is applied using a deep depletion-implant technique utilizing a predetermined amount of phosphorous to define an N− charge (95) adjacent to a second gate area or region (90) of the second MESFET 66, and having the relatively same dosage as the first implant where said second implant extends to predetermined depth D2 (D2 greater than D1).

Figure 5:
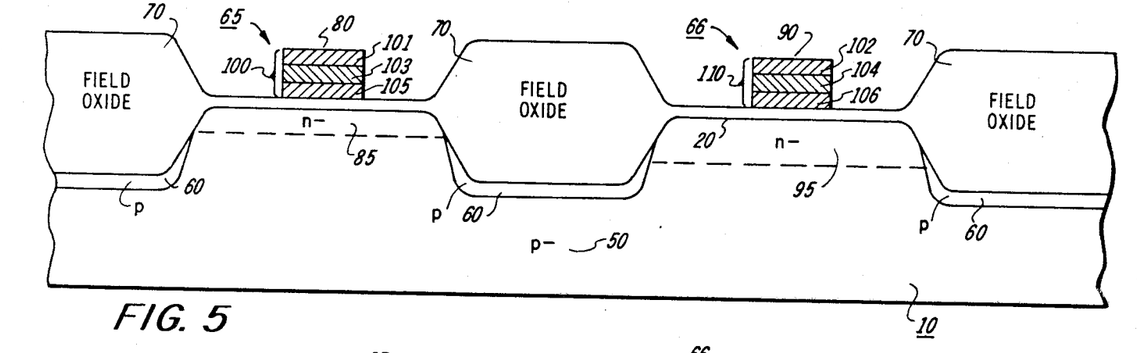
FIG. 5 is a schematic representation of a portion of the MESFET process sequence, following that of FIG. 4, at a point where a nitride/polysilicn/nitride sandwich deposition and Schottky masking have been accomplished.

In regards to FIG. 5, there is shown a schematic representation of that part of the process sequence including the steps of nitride deposition, polysilicon deposition and nitride deposition and using a schottky mask. In particular, two layered sandwich structures 100, 110, of predetermined width, each having nitride silicon (101, 102), polysilicon (103, 104), and nitride silicon (105, 106) layers will be formed using a schottky mask on the SiO₂ layer 20 proximate to the areas or regions that will ultimately comprise the first (80) and second 90 gates of first and second MESFET 65 and 66 respectively mentioned supra. The sandwiches 100, 110 are of predetermined width and may be equal in width.

Figure 6:
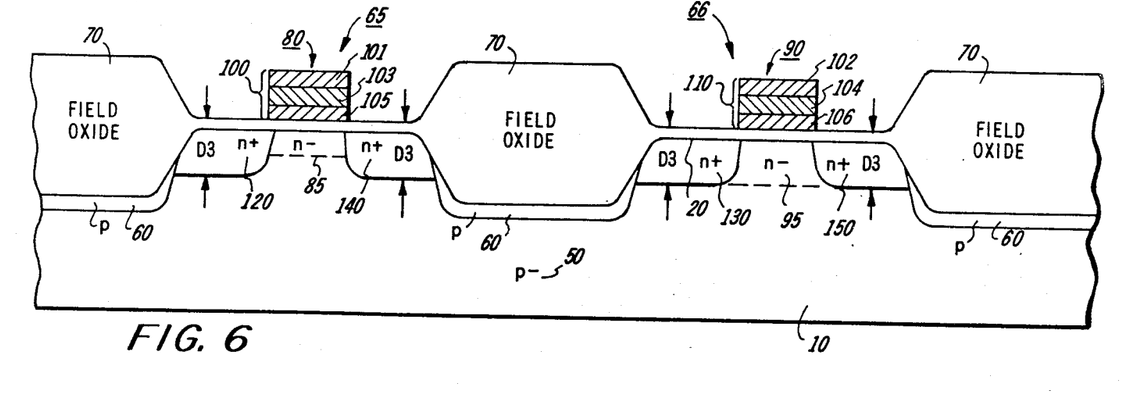
FIG. 6 is a schematic representation of a portion of the MESFET process sequence, following that of FIG. 5, at a point where n+source and drain implanting or diffusion have been accomplished.

In regards to FIG. 6, there is shown a schematic representation of that part of the process sequence including the steps of N+ source and drain implant (or diffusion). In particular, N+ source (120, 130) and drain (140, 150) areas or regions are formed to a D3 depth for first and second MESFETs 65 and 66 respectively by using arsenic (As) ion-implantion (or diffusion) thereby giving the N+ source/drain areas or regions (120, 130, 140, 150) a relatively higher dosage concentration than the N+ areas or regions (85, 95) of the first and second gates (80, 90). It will be noted that the sandwiches 100 and 110 act as a mask and result in the gates 80 and 90 being automatically self-aligned as between source (120, 130) and drain (140, 150) areas or regions.

Figure 7:
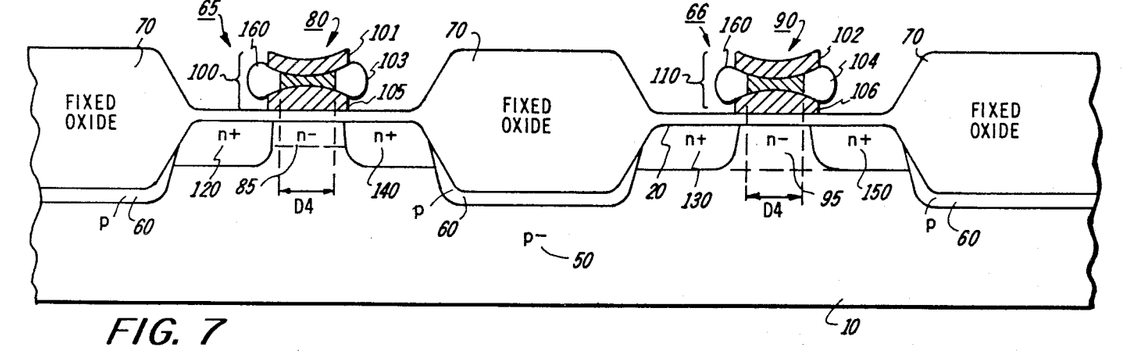
FIG. 7 is a schematic representation of a portion of the MESFET process sequence, following that of FIG. 6, at a point where the subsequence of channel length definition, including the step of poly silicon oxidation, has been accomplished.

In regards to FIG. 7, there is shown a schematic representation of that part of the process sequence including the subprocess of channel definition by polysilicon oxidation starting with the supra sandwiches 100 and 110 comprising the step of polysilicon oxidation. In particular, in order to define the channel length or gate width or end boundaries thereof which is to be relatively short/narrow (further defined infra) derivatively from the sandwich structures 100 and 110, polysilicon oxidation (or undercutting) through a thermal process may be performed on the polysilicon layers 103 and 104 of sandwiches 100 and 110 resulting in polysilicon oxide bulge 160 on either side of the polysilicon layers 103 and 104. Also, as part of the same process, convex/concave top/bottom surfaces are formed in the silicon nitride layers 101, 102. Likewise, convex/concave top bottom surfaces are formed in the silicon nitride layers 105, 106. The supra process is operative to define the predetermined equal channel length/gate width D4, mentioned supra, as that portion of the polysilicon layers 103 and 104 that was not oxidized therein.

Figure 8:
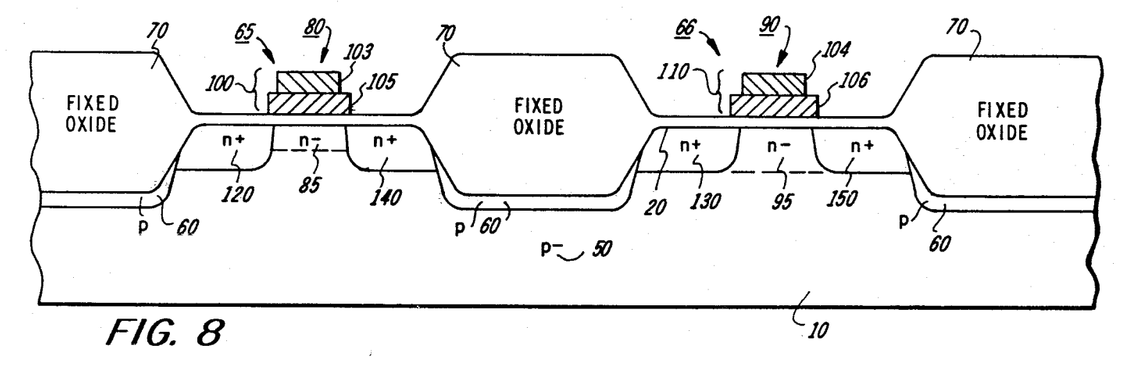
FIG. 8 is a schematic representation of a portion of the MESFET process sequence, following that of FIG. 7, at a point where the subsequence of channel length definition, including the step of etching top silicon nitride and polysilicon oxide, has been accomplished.

In regards to FIG. 8, there is shown a schematic representation of that part of the process sequence including the next step of the subprocess of channel definition by polysilicon oxidation comprising etching or removing the top nitride and polysilicon oxide layers of the sandwiches 100, 110. In particular, the top silicon nitride layers 101 and 102 are completely etched off as is the polysilicon oxide bulge portion 160 of the polysilicon layers 103 and 104 leaving a stepped-pyramid like topology comprising the polysilicon layers 103 and 104, and the bottom silicon nitride layers 105 and 106 of sandwiches 100, 110, respectively.

Figure 9:
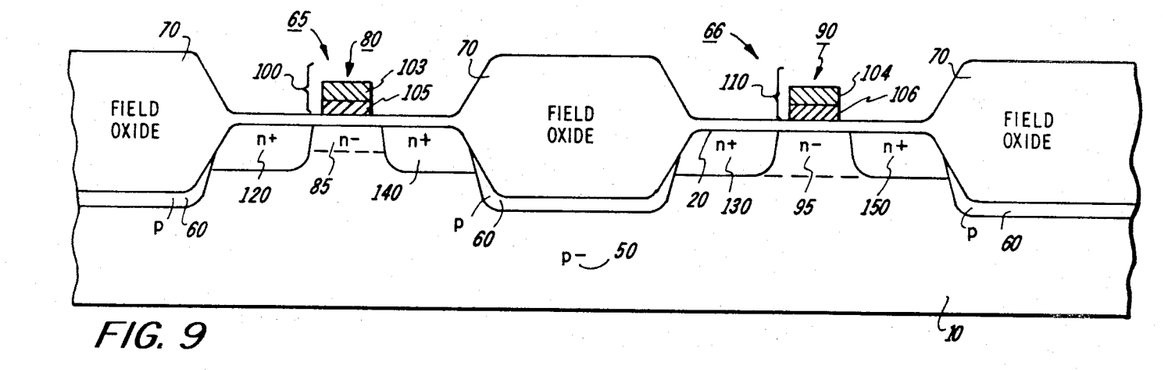
FIG. 9 is a schematic representation of a portion of the MESFET process sequence, following that of FIG. 8, at a point where the subsequence of channel length definition, including the step of etching off excess bottom silicon nitride, has been accomplished.

In regards to FIG. 9, there is shown a schematic representation of that part of the process sequence including the next step of the subprocess of channel definition by polysilicon oxidation comprising removing or etching off the excess bottom silicon nitride. In particular, the polysilicon layers 103 and 104 are effectively used as a mask when etching the bottom silicon nitride layers 105 and 106 insomuch as the polysilicon layers 103 and 104 have already been etched to the predetermined channel length/gate width D4 size and thus inherently pass on this characteristic to the silicon nitride layers 105 and 106 during the current etching or removal step.

Figure 10:
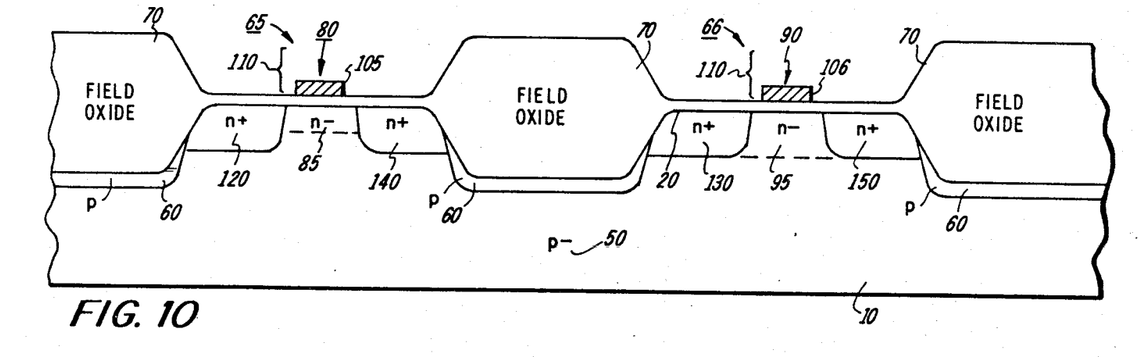
FIG. 10 is a schematic representation of a portion of the MESFET process sequence, following that of FIG. 9 at a point where the subsequence of channel length definition, including the step of removing polysilicon has been accomplished.

In regards to FIG. 10, there is shown a schematic representation of that part of the process sequence including the next step of the subprocess of channel definition by polysilicon oxidation comprising removing or etching off the polysilicon layers 103 and 104. In particular, etching off layers 103 and 104 leaves only the nitride layers 105 and 106 having the desired predetermined channel length D4 thereby defining the narrowness/shortness of the gate width.

Figure 11:
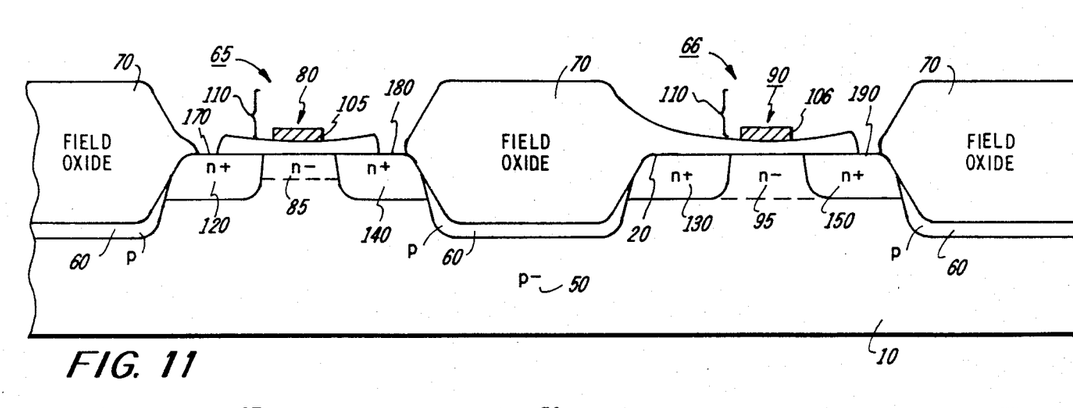
FIG. 11 is a schematic representation of a portion of the MESFET process sequence, following that of FIG. 10, at a point where steam oxidation and buried contact masking have been accomplished.

In regards to FIG. 11, there is shown a schematic representation of that part of the process sequence including the steps of steam oxidation, buried contact masking and the etching thereof. In particular, thermal oxidation through wet steam may be allowed to grow on top of the N+ areas 120, 130, 140 and 150 to a level of 2000 angstroms. In addition, source (170, none) and drain (180, 190) contacts or windows for first and second MESFETs 65 and 66 respectively are opened up or exposed by buried contact masking and then etching out the windows 170, 180, 190 with the result as shown in FIG. 11.

Figure 12:
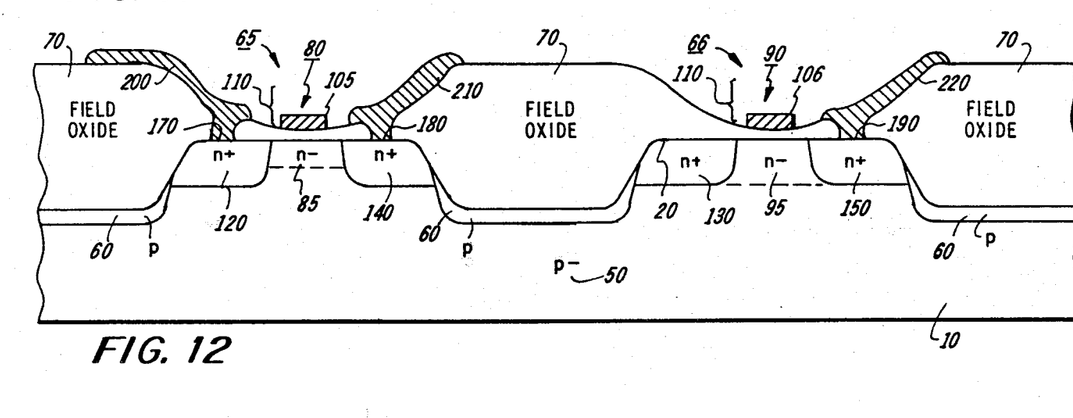
FIG. 12 is a schematic representation of a portion of the MESFET process sequence, following that of FIG. 11, at a point where polysilicon deposition, polysilicon diffusing and polysilicon masking have been accomplished.

In regards to FIG. 12, there is shown a schematic representation of that part of the process sequence including the steps of polysilicon deposition, diffusion, polysilicon masking and polysilicon etching. In particular, polysilicon deposition is applied along the entire surface profile represented by first and second MESFETs 65, 66. Next, phosphorous is thermally diffused into the profiled polysilicon deposition area or region. Then, the polysilicon is masked and etched to leave a deposition of polysilicon in areas or regions of varying widths 200, 210, 220 proximate thereto and therein the source and drain windows 170, 180 of the first MESFET 65 and the drain window 190 of the second MESFET 66 respectively.

Figure 13:
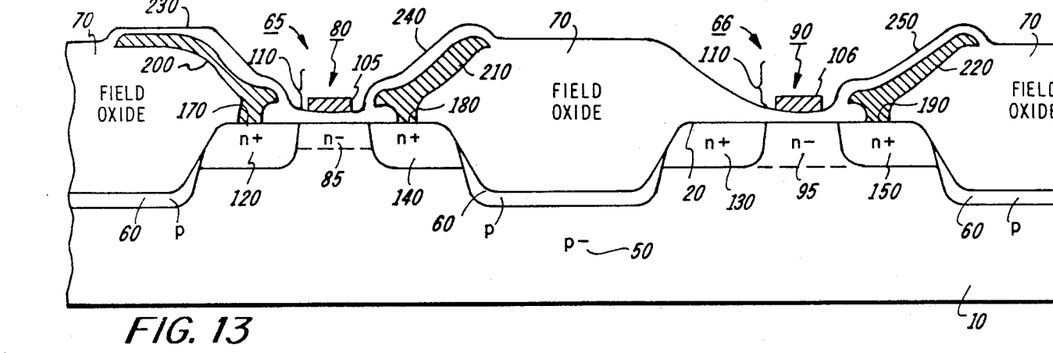
FIG. 13 is a schematic representation of a portion of the MESFET process sequence, following that of FIG. 12, at a point where steam oxidation of growing polysilicon oxide has been accomplished.

In regards to FIG. 13, there is shown a schematic representation of that part of the process sequence including the step of thermal oxidation. In particular, a predetermined thermal oxidation through the use of steam is applied as layers 230, 240, 250 to the polysilicon deposition areas or regions 200, 210 and 220 respectively to operatively grow a layer of polysilicon oxide to a depth of 4000 Angstroms.

Figure 14:
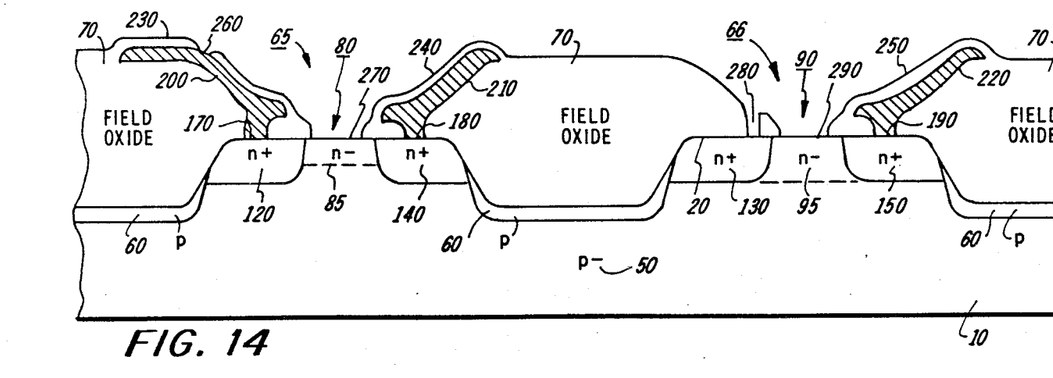
FIG. 14 is a schematic representation of a portion of the MESFET process sequence, following that of FIG. 13, at a point where contact masking and etching have been accomplished.

In regards to FIG. 14, there is shown a schematic representation of that part of the process sequence including the steps of contact masking and associated etching. In particular, by contact masking, it is possible to open or expose metal to polysilicon contact and depletion gate to source contact. Next, the silicon nitride layers 103 and 106 corresponding to first and second gates 80 and 90 respectively together with the remaining initial silicon oxidation layer 20 are removed or etched off leaving open source 260, 280 and gate 270, 290 contacts for the first and second MESFETs 65 and 66 respectively.

Figure 16:
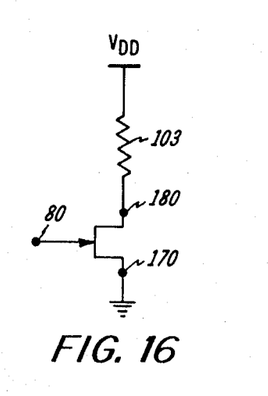
FIGS. 16 and 17 are circuit diagrams corresponding to FIG. 15, but with an alternative resistor load in FIG. 16.

In an alternate embodiment to that described in the supra paragraph as relates to FIG. 14, an N− resistor may simultaneously fabricated as a structural addition as shown in FIG. 16. In particular, one non-ciritical mask may be used to protect the silicon nitride 103 on the N− resistor area or region. This silicon nitride 103, in this case, would stay on as the final product.

Figure 15:
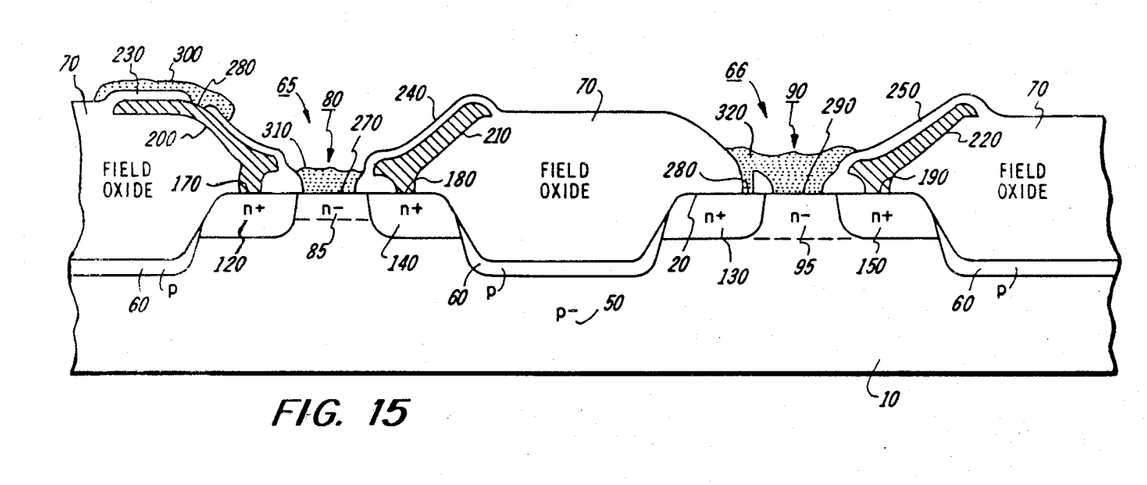
FIG. 15 is a schematic representation of a portion of the MESFET process sequence, following that of FIG. 14 at a point where sputtering deposition of platinum and titungsten, aluminum deposition and metal masking have been accomplished.
Figure 17:
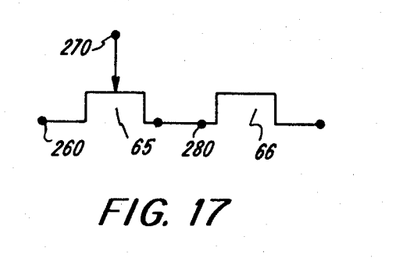

In regards to FIG. 15, there is shown a schematic representation of that part of the process sequence comprising the metalization subsequence for providing conductive source/gate/drain contacts for interconnections, including the steps of Deposition of a thin film of Platinium (pt), Titungsten (TiW) and Aluminum (Al), then metal masking and etching thereof. In particular, platinum is sputteringly deposited to a depth of 500 angstroms, annealized through a hot nitrogen gas flow, then etched with Aqua Regia, leaving an area or region 300 of varying width on the polysilicon area 230 adjact to the source contact 260 of the first MESFET 65 and also an area or region of varying width 310 on the gate contact 270 of the first MESFET 65. In addition, a collective area or region of varying width 320 is left on the source and gate contacts 280 and 390 of the second MESFET 66 thereby leaving the source and gate contacts thereof electrically connected as shown in FIG. 17. Additionally, a sputtering deposition of Ti-tungsten is made to a depth of 2000 angstroms disposed over the surface area or region of the first and second MESFETs 65 and 66. Finally, an aluminum layer is evaporated over the titungsten layer described supra. Metal masking and etching of the titungsten and aluminum-layers is then effected leaving titungsten and aluminum-layers that are spatially analogous and disposed over the platinum layers 300, 310, 320 all being of predetermined depth. The supra described spatially proximate platinum, titungsten and aluminum-layers are then sintered to give a resultant coherent mass. It will be noted that the metal depositions 310 and 320 interface with the N− semiconductor area 85 and 95 at gate contacts 270 and 290 of the MESFETs 65 and 66 respectively form a Schottky barrier and thus a Schottky gate in regards to said MESFETs.

An alternative embodiment (not shown) to that described supra comprises the elimination of the buried contact mask including the steps embodied in the description of FIGS. 11 and 12. The effect of the supra elimination being a simpler signal-layer of metal interconnection rather than a double layer of poly-silicon and metal as shown in FIG. 15.

It will be noted that in regards to the supra description, elements that can vary in values and or proportions include silicon substrate resistivity, enhancement and depletion channel implants, schottky gate formation, oxidation and etching steps of poly-silicon in the nitride/poly/nitride gate sandwich structure, and the interconnection process in regards to the single-layer metal or two-layer poly/metal described supra.

Particular advantages inherent to the above invention as relates to MESFET technology include much improved gain, higher circuit density, self-aligned schottky gate, controlled minimum series resistance, relatively short channel length as compared to that obtained in a conventional photoprocess, optionally ease of fabrication of a n-resistor network simultaneously as an alternative addition to the above embodiment. Specifically, features being that gate to source/-drain spaces or windows are controlled by polysilicon oxidation and etching in the gate sandwich structure. In addition, channel implant profiles are protected by the gate sandwich structure and are not disturbed by the oxidation step in the given process.

Although the preferred embodiments of the invention have been described in considerable detail, it will be apparent that various changes and modifications therein may be made by those skilled in the art without departing from the true spirit and scope of the invention.

What is claimed is:

1. A method of making a narrow gate MESFET comprising the steps of:
   a. preparing a layered mask of nitride and polysilicon on a substrate over a channel region therein;
   b. oxidizing a predetermined amount of the polysilicon layer on both sides of said layered mask;
   c. removing the oxidized polysilicon of said layered mask for allowing the polysilicon layer of said layered mask that remains to be relatively predeterminably narrower than the nitride layer;
   d. etching the nitride layer of said layered mask to be disposed only under the polysilicon layer of said layered mask thereby defining the gate region;
   e. oxidizing the surface of the substrate to form an oxide layer of predetermined thickness;
   f. removing the nitride layer of said layered mask; and
   g. depositing of metal on the gate region to form the MESFET gate.

2. The method of claim 1 wherein said steps of oxidizing a predetermined amount of the polysilicon layer on both sides of said layered mask includes the step of oxidizing the predetermined amount of the polysilicon layer on both sides of said layered mask according to predetermined dimensions.

3. The method of claim 2 including the step of implanting source and drain regions in said substrate, said source and drain regions are aligned to bound either side of the said defined gate region.

4. The method of claim 1 wherein said step of preparing said layered mask of nitride and polysilicon includes the step of forming a sandwich of polysilicon between two layers of nitride, and also said step of removing said oxidized layer of polysilicon includes the step of removing the layer of nitride disposed on the opposite side of the polysilicon from the substrate.

5. The method of claim 3 wherein said step of oxidizing said substrate to define the gate region includes the step of forming oxide over the source and drain regions and removing a portion of said oxide to expose source and drain contacts.

6. The method of claim 3 wherein said step of implanting source and drain regions includes the step of implanting regions of predetermined dimensions.

7. The method of claim 5 wherein said step of exposing source and drain regions includes the step of depositing polysilicon over the exposed source and drain regions and also said step of removing said nitride mask precedes the additional step of etching a portion of said oxide to expose polysilicon contacts.

8. The method of claim 7 wherein said step of depositing includes the step of depositing metal on said exposed polysilicon contacts.

9. The method of claim 2 wherein said step of oxidizing said substrate to define the gate region includes the step of forming oxide over the source and drain regions and removing a portion of said oxide to expose source and drain contacts.

10. The method of claim 2 wherein said step of implanting source and drain regions includes the step of implanting regions of predetermined dimensions.

11. The method of claim 9 wherein said step of exposing source and drain contacts includes the step of depositing polysilicon over the exposed source and drain contacts and also said step of removing said nitride mask precedes the additional step of etching a portion of said oxide to expose a polysilicon contact.

12. The method of claim 9 wherein said step of depositing includes the step of depositing metal on said exposed polysilicon contacts.

13. The method of claim 5 wherein said step of exposing source and drain contacts includes the step of depositing polysilicon over one of said exposed contacts, leaving the other said contact exposed and also said step of removing the said nitride mask precedes the additional step of etching a portion of said oxide to expose a polysilicon contact.

14. The method of claim 13 wherein said step of depositing includes the step of deposition of metal on the exposed polysilicon contact and on said contact remaining reexposed after the deposition of said polysilicon.

15. The method of claim 9 wherein said step of exposing source and drain contacts includes the step of depositing polysilicon over one of said exposed contacts, leaving the other said contact exposed and also said step of removing said nitride mask precedes the additional step of etching a portion of said oxide to expose a polysilicon contact.

16. The method of claim 15 wherein said step of depositing includes the step of deposition of metal on the exposed polysilicon contact and on the said contact remaining reexposed after the deposition of said polysilicon.

* * * * *